Sept. 27, 1960 E. I. DOUCETTE ET AL 2,954,551

FIELD EFFECT VARISTOR CIRCUITS

Filed April 10, 1958 2 Sheets-Sheet 1

INVENTORS: E. I. DOUCETTE
W. J. GRUBBS, Jr.

BY Alan C. Rose

ATTORNEY

Sept. 27, 1960 E. I. DOUCETTE ET AL 2,954,551

FIELD EFFECT VARISTOR CIRCUITS

Filed April 10, 1958 2 Sheets-Sheet 2

INVENTORS: E. I. DOUCETTE
W. J. GRUBBS, Jr.

BY Alan C. Rose

ATTORNEY 2,954,551

FIELD EFFECT VARISTOR CIRCUITS

Edward I. Doucette, Summit, and William J. Grubbs, Jr., Stirling, N.J., assignors to Bell Telephone Laboratories, Incorporated, New York, N.Y., a corporation of New York Filed Apr. 10, 1958, Ser. No. 727,655

3 Claims. (Cl. 340—347)

This invention relates to electrical switching circuits, and more particularly to switching circuits for selectively applying currents through two or more paths to a common load or output network.

In the data processing field it is often necessary to convert numbers or other digitally coded information into analog output signals. The analog signals may then be utilzed to provide a visual display, as in the case of the deflection circuits for an oscilloscope, or for some other useful purpose.

Resistance weighting networks of various types are often employed in digital-to-analog converters. However, such networks are subject to many adverse effects which tend to introduce errors into the analog output signal. For example, variations in the supply voltage frequently produce corresponding changes in the output signal. In addition, when a summing resistor is employed, the back voltage developed across the resistor tends to distort the analog output signal.

Accordingly, an important object of the invention is to reduce distortion in digital-to-analog code conversion circuits.

Another object of the present invention is the improvement and simplification of converter circuits.

In accordance with the present invention, a converter circuit utilizes so-called "field effect varistors" to supply increments of current to a summing network. A field effect varistor is a two-terminal semiconductor device which has a constant current region which extends over a considerable voltage range. In one simple version of the field effect varistor the constant current range is obtained by a semiconductor geometry including p-type and n-type portions, in which the two terminals of the varistor are both connected to semiconductor material of one conductivity type. In addition, the cross-section of the semiconductive material of one conductivity type between the two terminals is severely restricted. Various alternative structures and the mode of operation of the field effect varistors are disclosed in application Serial No. 700,319, filed December 3, 1957 of E. I. Doucette, H. A. Stone, Jr., and R. M. Warner, Jr. Through the use of these field effect varistors, the increments of current applied to the summing network are substantially independent of considerable variations of the supply voltage, and of the back voltage developed in the summing network.

It is a feature of the invention that a digital-to-analog code converter include a summing network and several field effect varistors which are selectively connected to apply increments of current to the summing network in accordance with applied digital code signals.

In accordance with another feautre of the invention, two or more field effect varistors are coupled to a common circuit so that current flow in one of the varistors affects the voltage across the other varistor, and switching circuitry is also provided for selectively connecting each of said field effect varistors to said common circuit, with the potential across each of said varistors being within its constant current range.

It is an additional feature of the invention that temperature compensation of the field effect varistors in circuits such as those defined in the preceding paragraphs is provided by resistors having a temperature coefficient of resistance of the same sign and of substantially the same magnitude as that of the field effect varistors.

Other objects, features, and advantages of the invention may be readily understood from a consideration of the following detailed description and the accompanying drawing, in which.

Figure 1:
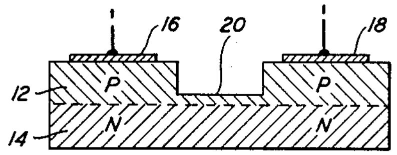
Fig. 1 represents an illustratve field effect varistor.

With reference to Fig. 1, the drawing shows one illustrative type of field effect varistor. The field effect varistor shown in Fig. 1 includes semiconductive material of positive and negative conductivity types. Thus, the upper portion 12 of the field effect varistor is formed of p-type semiconductor material, and the lower portion 14 is formed of n-type semiconductor material. The field effect varistor is a two-terminal device and, as shown in Fig. 1, it has two extended low resistance terminals 16 and 18 connected to the upper or p-type portion 12 of the semiconductor body. Between the two terminals 16 and 18 is a recess or "ditch" 20 which severely restricts the cross-section of p-type material between the two terminals 16 and 18.

Figure 2:
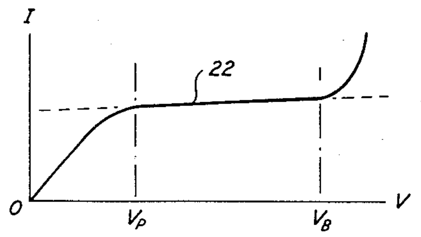
Fig. 2 shows the current voltage characteristic of the field effect varistor of Fig. 1.

Fig. 2 is a plot of current against voltage for a field effect varistor such as that shown in Fig. 1. The principal point of interest with regard to the charcteristic of Fig. 2 is the extended region 22 of substantially constant current with increasing voltage. In Fig. 2, this constant current region 22 extends from the voltage designated $V_P$ to the voltage designated $V_B$. The voltage $V_P$ at which the constant current region begins has been termed the "pinch-off" voltage, in view of the restriction in increasing current resulting from the confining or pinching of the current through the restricted portion of the p-type material as shown in Fig. 1. The voltage designation $V_B$ stands for breakdown voltage, and indicates the point of increased current flow following breakdown of the semiconductor device. It is understood that the carriers flowing in the p-type region create a field effect which restricts current flow within the region designated 20 in Fig. 1. Once the voltage reaches the "pinch-off" voltage, further increases in voltage do not produce increased current flow, as indicated by the portion 22 of the plot of Fig. 2. In addition, the nondestructive breakdown which occurs at voltages above the breakdown voltage $V_B$ is analogous to that which occurs in avalanche breakdown devices. For further details of the theory and alternative structures which may be employed in field effect varistors, reference is again made to E. I. Doucette et al., application Serial No. 700,319, filed December 3, 1957.

Figure 3:
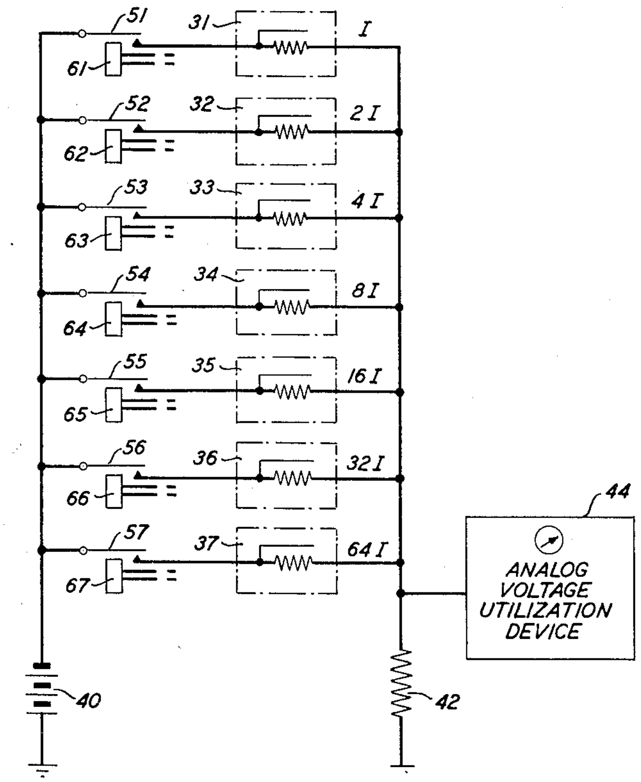
Fig. 3 is a circuit diagram of a digital-to-analog converter in accordance with the invention which uses field effect varistors.

Fig. 3 is a circuit diagram of a digital-to-analog encoder in accordance with the present invention in which field effect varistors 31 through 37 are employed. Other components of the digital-to-analog converter circuit include the voltage source 40, the summing resistor 42, and the analog voltage utilization device 44. Contacts 51 through 57 are also provided to control the application of voltage from source 40 to the individual field effect varistors 31 through 37. Increments of current from the selected varistors are applied to the summing resistor 42. The contacts 51 through 57 may, for example, be controlled by the relays 61 through 67. The energization of relays 61 through 67 may be in accordance with a predetermined digital code. For specific example, the code may be a seven-digit binary number. The least significant digit of the binary number is represented by the energization or de-energization of relay 61 to represent a binary "1" or "0," respectively. In a similar manner, the states of the successive relays 62 through 67 represent the additional digits of the seven-digit binary number.

The field effect varistors 31 through 37 are chosen to have constant current regions in which the magnitude of the current corresponds to the weighing of the successive binary digits. Thus, the field effect varistor 31 associated with contacts 51, corresponding to the least significant binary digit, has a current weighting designated "I." The current ratings of the successive field effect varistors 32 through 37 are doubled successively to a value of 64I for the varistor 37.

By way of specific example, the voltage source 40 may have a value of 40 volts and the resistor 42 a value of 1,000 ohms. The constant current level for the field effect varistor 31 may, for example, be 100 microamperes. In addition, $V_P$ and $V_B$ as shown in Fig. 2 may, for example, be 10 and 100 volts, respectively, for all of the varistors 31 through 37. The output voltage to the utilization device 44 then increases by 100 millivolts per unit, and the maximum output voltage is 12.7 volts. The encoder of Fig. 3 therefore has 128 steps from a zero output voltage to the 12.7 volt maximum in successive 100 millivolt steps.

With an ordinary resistance network the analog output voltage developed across the summing resistor would reduce the voltage across each of the current weighting resistance elements. In the example considered above, this reduction would be from 40 volts to a minimum of 27.3 volts. The output signal would be in error by more than 30 percent under these conditions. Using the field effect varistors, however, the error in output signal would be less than 1 percent under the same conditions.

Figure 4:
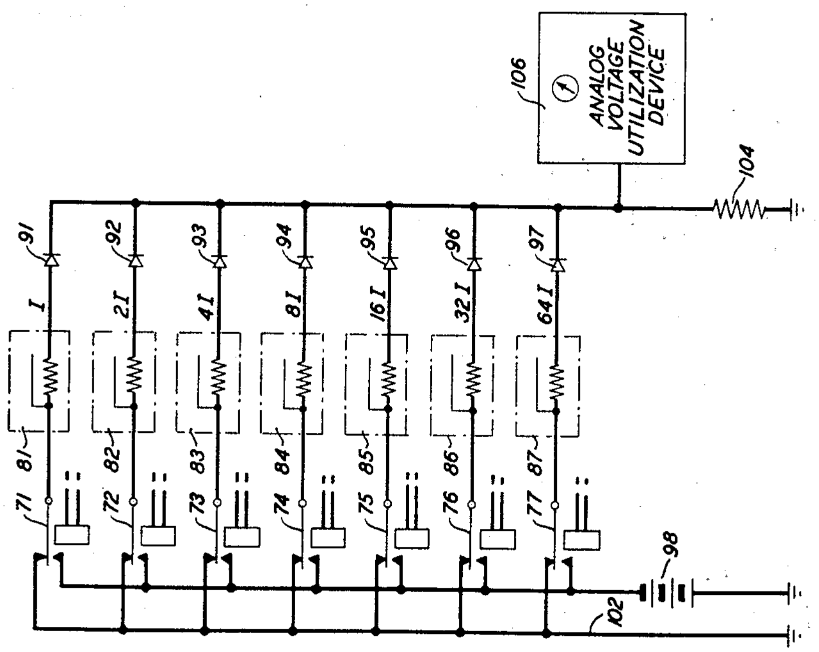
Fig. 4 is another digital-to-analog encoder circuit in accordance with the invention.

The circuit of Fig. 4 is generally similar to that of Fig. 3, but includes input switching circuitry for applying two voltage levels to the field effect varistors. In one position, the contacts 71 through 77 are at a discrete voltage level, and in the other position, the input contacts apply ground potential to the field effect varistors 81 through 87. The diodes 91 through 97 are provided to prevent so-called "sneak" paths from the voltage source 98 through some of the field effect varistors back to the ground lead 102. In the case of the circuit of Fig. 4, the summing resistor 104 and the output utilization circuit 106 perform substantially the same functions as the corresponding elements 42 and 44 of Fig. 3.

Figure 5:
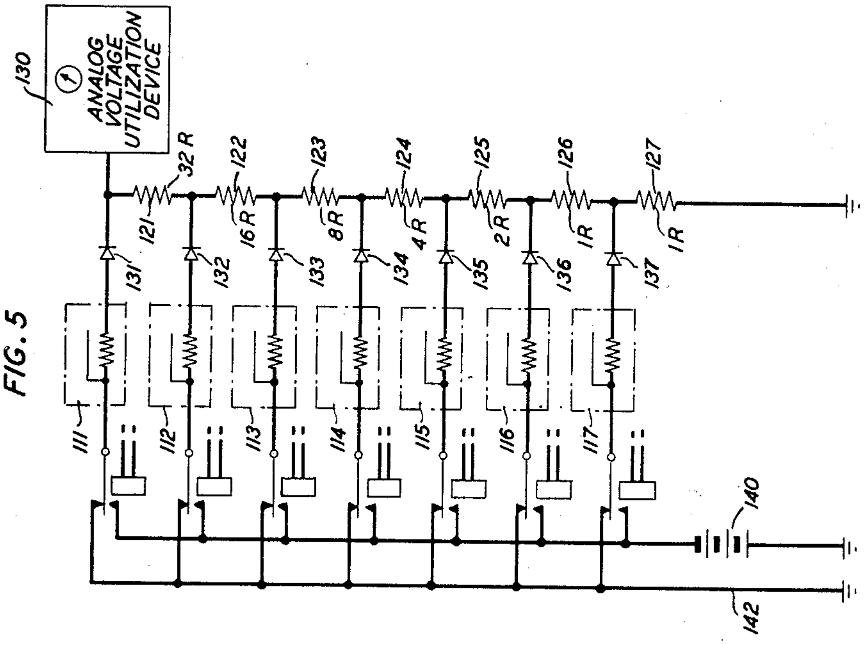
Fig. 5 is a third representatvie embodiment of the invention.

The circuit of Fig. 5 is generally similar to that of Fig. 4, but includes a set of identical field effect varistors 111 through 117. The weighting of current increments from the varistors 111 through 117 is accomplished by the resistance weighting network including resistors 121 through 127 which have the relative values indicated in terms of the smallest resistors 126 and 127 of the group. It may be noted that the current flow through field effect varistor 111 corresponds to the presence of the most significant digit of the input binary code, in contrast to the arrangement of each of Figs. 3 and 4, in which the most significant digit of the binary code is represented by current flow through the lowermost field effect varistor. The diodes 131 through 137 are again required to prevent current flow from the supply voltage source 140 to the input ground lead 142. The analog output circuit 130 may, for example, be a voltmeter or the input circuits to an oscilloscope display.

It may be noted that the circuit diagram of Fig. 3 shows one type of relay input circuit and the circuit diagrams of Figs. 4 and 5 show another type of relay input circuit. In the first case, a digital code was represented by the presence of a voltage or an open-circuited condition at the input to each of the field effect varistors. In the case of the circuits of Figs. 4 and 5, however, the digital input signals were represented by two different voltage levels at the input terminals. In this regard, it may be noted that the circuit of Fig. 5 could be used with inputs like those of Fig. 3, in which case the diodes would not be required. It is also to be understood that comparable electronic circuits including transistors or vacuum tubes, for example, could be employed to provide input signals of either of these two general types. It may also be noted that summing elements or networks other than the resistance networks shown in the present drawing could be used. Thus, by way of illustration, the increments of current could be applied to the deflection coils of an oscilloscope or a sensitive instrument, for example.

In Fig. 5 the resistors 121 through 127 advantageously have temperature coefficients of resistance which match the temperature coefficients of resistance of the field effect varistors 111 through 117. With such an arrangement, the variations in analog output voltage with changes in ambient temperature can be substantially eliminated. In one specific instance the current of a field effect varistor has been found to be proportional to the majority carrier mobility of the semiconductor material. Accordingly, the varistor exhibits a positive coefficient of resistance. The temperature coefficient of resistance of resistors 121 through 127 should correspond to that of the field effect varistors. For use with field effect varistors such as the one mentioned above, therefore, resistors are employed which also have a positive temperature coefficient of resistance. The resistors 121 through 127 may, for example, be semiconductor resistors of the same material as the varistors, and have temperature coefficients of the same sign and of approximately the same magnitude.

The advantages of the present circuits over conventional converters utilizing ordinary resistor networks merit restatement. Specifically, when field effect varistors are employed, the back voltage from the summing impedance causes no adverse distortion. Similarly, substantial changes in the supply voltage level may be tolerated without introducing errors at the output utilization circuit. Accordingly, the use of field effect varistors obviates the need for the carefully regulated supply voltages and special compensation circuits which are frequently employed in digital-to-analog converter circuits.

It is to be understood that the above-described arrangements are illustrative of the application of the principles of the invention. Numerous other arrangements may be devised by those skilled in the art without departing from the spirit and scope of the invention.

What is claimed is:

1. In a digital-to-analog converter a current-responsive summing element, a voltage source, a plurality of field effect varistors, a plurality of enabling means each under the control of input digital information for inserting selected ones of said field effect varistors in a closed electrical path between said voltage source and summing element whereby the current flowing in the summing element is an analog measure of the digital information, and an analog voltage utilization means connected across said summing element.

2. A converter as defined in claim 1 in which each of said field effect varistors has a different constant current level.

3. A converter as defined in claim 1 wherein said enabling means includes circuitry for applying a ground potential or coupling said voltage source to said closed electrical path.

References Cited in the file of this patent

UNITED STATES PATENTS

| | | |
|---|---|---|
| 2,015,533 | Logan | Sept. 17, 1935 |
| 2,170,193 | Godsey | Aug. 22, 1939 |
| 2,658,139 | Abate | Nov. 3, 1953 |
| 2,701,289 | Kurshan | Feb. 1, 1955 |
| 2,731,631 | Spaulding | Jan. 17, 1956 |
| 2,738,504 | Gray | Mar. 13, 1956 |
| 2,803,815 | Wulfsberg | Aug. 20, 1957 |
| 2,827,233 | Johnson et al. | Mar. 18, 1958 |